United States Patent
Pharand et al.

(10) Patent No.: US 7,100,759 B2
(45) Date of Patent: Sep. 5, 2006

(54) MAGNETIC SUPPORT STRUCTURE FOR AN ELEVATOR TUBE OF A VERTICAL RAPID THERMAL PROCESSING UNIT

(75) Inventors: Michel Pharand, Chelmsford, MA (US); Dennis Normandin, Chelmsford, MA (US); Ari Eiriksson, Reykjavik (IS)

(73) Assignee: Axcelis Technologies, Inc., Beverly, MA (US)

( * ) Notice: Subject to any disclaimer, the term of this patent is extended or adjusted under 35 U.S.C. 154(b) by 63 days.

(21) Appl. No.: 10/914,343

(22) Filed: Aug. 9, 2004

(65) Prior Publication Data
US 2006/0027440 A1 Feb. 9, 2006

(51) Int. Cl.
*B65G 35/00* (2006.01)
(52) U.S. Cl. ............................ 198/619; 414/3
(58) Field of Classification Search ................ 198/619, 198/805; 414/3, 217, 749.2
See application file for complete search history.

(56) References Cited

U.S. PATENT DOCUMENTS

| | | | |
|---|---|---|---|
| 4,457,423 A * | 7/1984 | Stoll ........................... | 198/619 |
| 4,790,258 A * | 12/1988 | Drage et al. ................ | 118/500 |
| 4,857,689 A | 8/1989 | Lee | |
| 4,893,980 A * | 1/1990 | Balter .......................... | 414/3 |
| 4,952,299 A | 8/1990 | Chrisos et al. | |
| 5,284,411 A * | 2/1994 | Enomoto et al. ........... | 198/619 |
| 5,561,612 A | 10/1996 | Thakur | |
| 5,620,523 A | 4/1997 | Maeda et al. | |
| 5,639,206 A * | 6/1997 | Oda et al. .................... | 198/619 |
| 5,715,361 A | 2/1998 | Moslehi | |
| 5,900,177 A | 5/1999 | Lecouras et al. | |
| 6,183,565 B1 | 2/2001 | Granneman et al. | |
| 6,393,210 B1 | 5/2002 | Wu | |
| 6,408,767 B1 | 6/2002 | Binnard et al. | |

* cited by examiner

Primary Examiner—James R. Bidwell
(74) Attorney, Agent, or Firm—Watts Hoffmann Co., LPA

(57) ABSTRACT

A vertical rapid thermal processing system includes a processing chamber and an elevator structure providing for vertical movement of a workpiece within the processing chamber. The elevator structure includes a workpiece support for supporting the workpiece and an elevator shaft coupled to the workpiece support and extending externally from the processing chamber. An end portion of the elevator shaft, external to the processing chamber, has a selected magnetic polarity. The elevator structure also includes moveable carriage coupled to the shaft to provide vertical movement of the workpiece within the processing chamber. The carriage includes a shaft support having the selected polarity. The shaft support is positioned adjacent the polarized end portion of the elevator shaft such that repulsive magnetic forces maintain a gap between the end portion of the elevator shaft and the shaft support as the shaft support and elevator shaft move vertically along a path of travel.

30 Claims, 2 Drawing Sheets

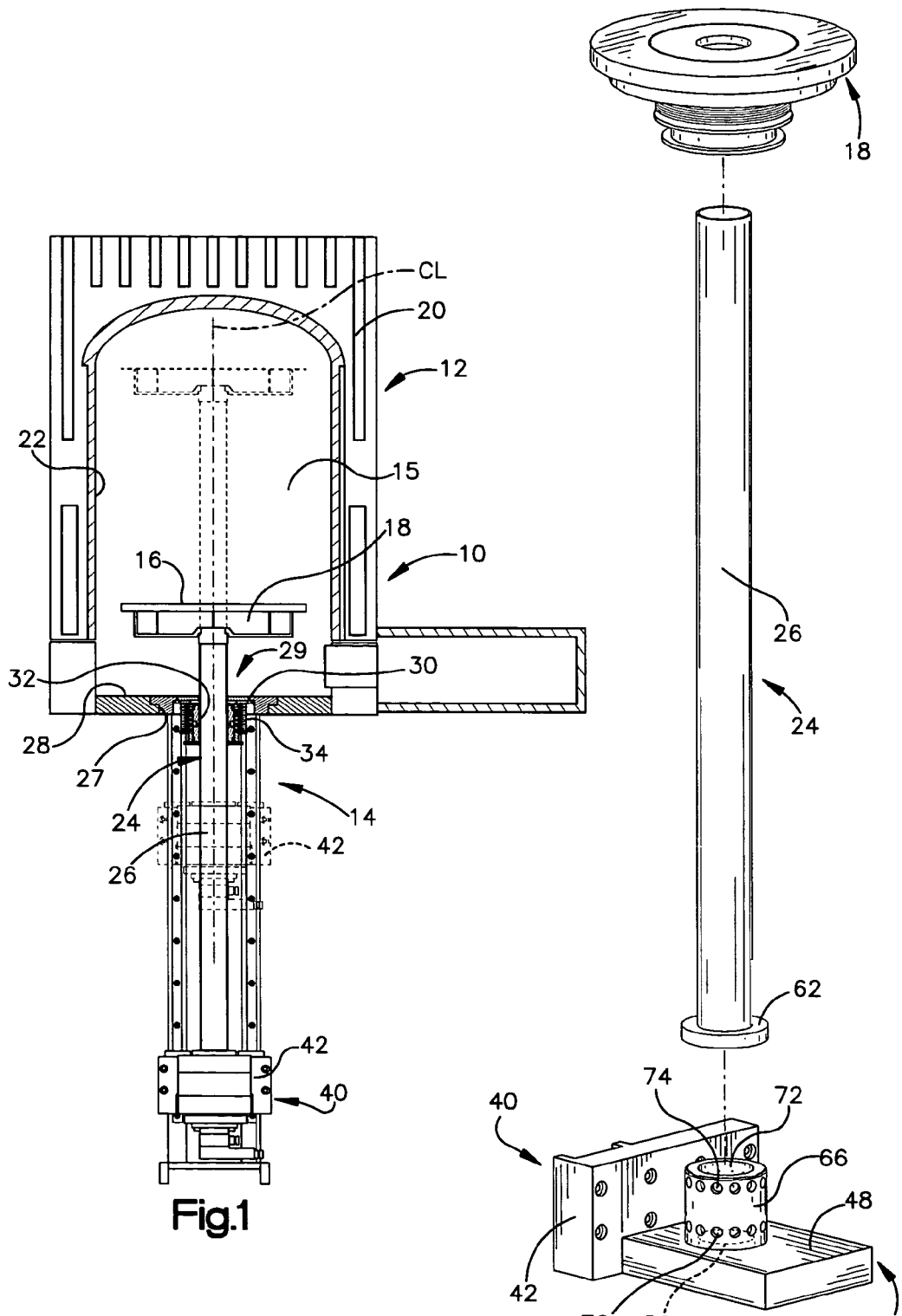

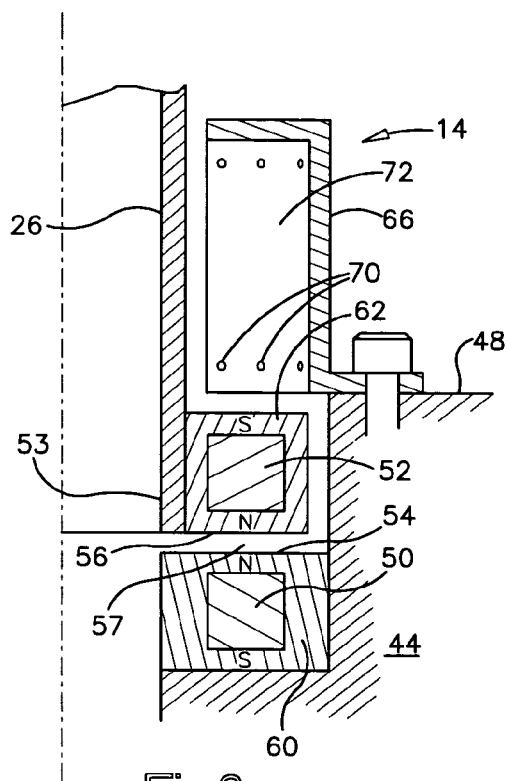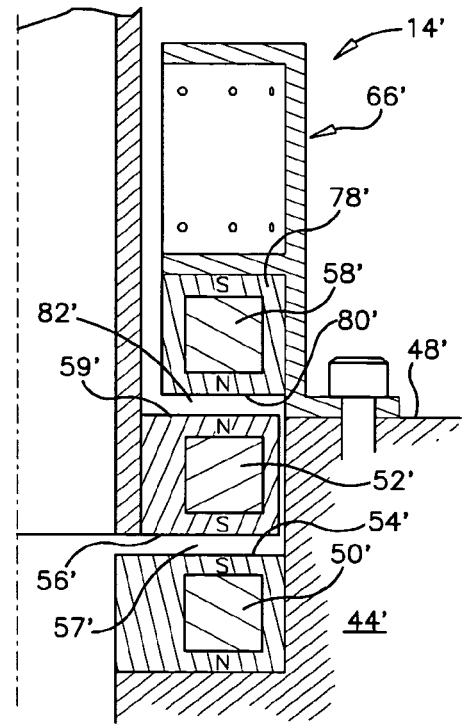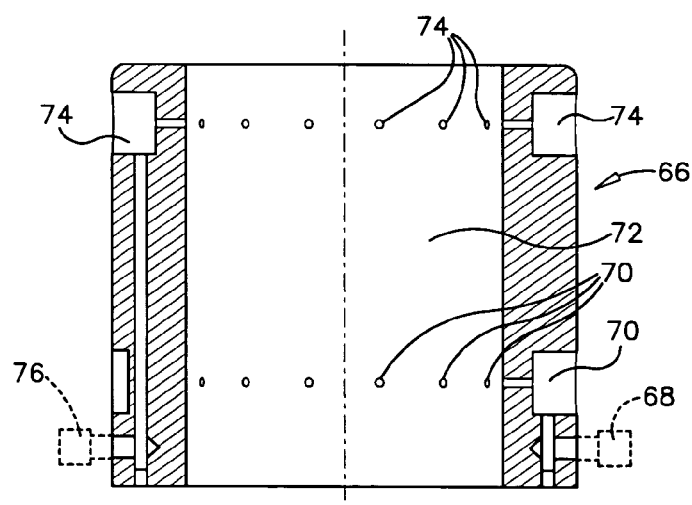

MAGNETIC SUPPORT STRUCTURE FOR AN ELEVATOR TUBE OF A VERTICAL RAPID THERMAL PROCESSING UNIT

TECHNICAL FIELD

The present invention relates generally to the field of semiconductor thermal processing systems and, more specifically, to a vertical rapid thermal processing unit that includes an elevator assembly for positioning a workpiece within the processing unit.

BACKGROUND OF THE INVENTION

Thermal processing systems are widely used in various stages of semiconductor fabrication. Basic thermal processing applications include chemical deposition, diffusion, oxidation, annealing, silicidation, nitridation, and solder re-flow processes. Vertical rapid thermal processing (RTP) systems comprise a vertically oriented processing chamber which is heated by a heat source such as a resistive heating element or a bank of high intensity light sources. An elevator structure is controlled to move a workpiece such as a wafer workpiece on a workpiece support vertically within the processing chamber. The elevator structure of prior art RTP's typically included a vertically-oriented moveable elevator shaft which extended into the processing chamber. The workpiece support was affixed to an upper end of the elevator shaft. A lower end of the elevator shaft was coupled to a vertically moveable carriage that allowed the elevator shaft to move vertically with respect to the processing chamber and, therefore, allowed the workpiece to move vertically within the processing chamber.

In some RTP systems, the heat sources create a temperature gradient within the processing chamber and temperature ramp-up and ramp-down rates of the wafer being processed are controlled by the vertical location of the workpiece within the processing chamber. Therefore, to optimize the thermal processing of semiconductor workpieces it is important to accurately control the vertical position of the workpiece within the processing chamber.

In addition to accurately controlling the vertical position of the workpiece within the processing chamber, it is also desirable to minimize vibration imparted to the workpiece via the elevator structure. Vibration may cause the workpiece to move horizontally relative to the support, thereby losing concentricity with the support structure. Lack of concentricity results in temperature non-uniformity near the workpiece perimeter.

One approach to reducing vibration in elevator structures of prior art RTP's was providing a rigid base which was affixed to a lower end of the elevator shaft. The rigid base was thought to minimize vibration that may be transmitted through the elevator shaft and imparted to the workpiece. However, since the elevator structure does have to move vertically, the base necessarily had to be affixed to the vertically movable carriage. Thus, in spite of the rigid base affixed to the lower end of the elevator shaft, vibrations from external sources could be still transmitted through the vertically movable carriage, the base, the elevator shaft, the workpiece support and, finally, to the workpiece itself.

What is needed is a system that facilitates both accurate movement and positioning of a workpiece within the RTP processing chamber and minimizes vibration transmitted to the workpiece. What is also needed is a system that isolates the workpiece support within the processing chamber from the moveable carriage outside of the processing chamber.

What is also needed is a method that facilitates both accurate movement and positioning of a workpiece within the RTP processing chamber and minimizes vibration transmitted to the workpiece. What is also needed is a method that isolates the workpiece support within the processing chamber from the moveable carriage outside of the processing chamber.

SUMMARY OF THE INVENTION

A vertical rapid thermal processing system includes a processing chamber and an elevator structure extending into an interior region of the processing chamber. The present invention provides for mechanical isolation of a portion of the elevator structure extending into the processing chamber interior region and supporting a workpiece within the processing chamber and a carriage, external to the processing chamber that provides for vertical movement of the workpiece within the processing chamber.

In one exemplary embodiment of the present invention, a vertical rapid thermal processing system includes a processing chamber and an elevator structure extending into the processing chamber for movably supporting a workpiece within the processing chamber. The elevator structure includes a workpiece support for supporting the workpiece and an elevator shaft extending into the processing chamber and coupled to the workpiece support. An end portion of the elevator shaft, external to the processing chamber, has a selected magnetic polarity. The elevator structure also includes moveable carriage coupled to the shaft to provide vertical movement of the workpiece within the processing chamber. The carriage includes a shaft support having the selected polarity. The shaft support is positioned adjacent the polarized end portion of the elevator shaft such that repulsive magnetic forces maintain a gap between the end portion of the elevator shaft and the shaft support as the shaft support and elevator shaft move vertically along a path of travel.

In another exemplary embodiment of the present invention, an elevator tube positioning system includes a workpiece support for supporting a workpiece within a process chamber and an elevator tube coupled to the workpiece support and extending externally of the process chamber. An end portion of the elevator shaft, external to the processing chamber, has a selected magnetic polarity. The elevator tube positioning system also includes moveable carriage coupled to the elevator shaft to provide vertical movement of the workpiece within the processing chamber. The carriage includes a shaft support having the selected polarity. The shaft support is positioned adjacent the polarized end portion of the elevator shaft such that repulsive magnetic forces maintain a gap between the end portion of the elevator shaft and the shaft support as the shaft support and elevator shaft move vertically along a path of travel.

These and other objects, advantages, and features of the exemplary embodiment of the invention are described in detail in conjunction with the accompanying drawings.

BRIEF DESCRIPTION OF THE DRAWINGS

FIG. 1 is a schematic cross-section view of a rapid thermal processing unit including a processing chamber and an elevator tube positioning system in accordance with an embodiment of the present invention;

FIG. 2 is a schematic exploded perspective view of the elevator tube assembly and a portion of a carriage assembly of the elevator tube positioning system of FIG. 1;

FIG. 3 is a schematic cross-section view of a lower portion of the elevator tube assembly and a portion of the carriage assembly of FIG. 2;

FIG. 4 is a schematic cross-section view of a gas bearing of the carriage assembly of FIG. 2; and FIG. 5 is a schematic cross-section view of a lower portion of an elevator tube and a portion of a carriage assembly in a second preferred embodiment an elevator tube positioning system of the present.

DETAILED DESCRIPTION

FIRST PREFERRED EMBODIMENT

FIG. 1 illustrates a rapid thermal processing (RTP) system 10 that uses a cylindrical hot wall system to thermally process workpieces, such as semiconductor wafers. The system includes a processing chamber, show generally at 12 and an elevator tube positioning system, shown generally at 14. A workpiece 16 is placed on a workpiece support 18 of the elevator tube positioning system 14. The workpiece 16 is moved, by the elevator tube positioning system 14, vertically through the processing chamber 12 having a temperature gradient created by heating elements 20 behind the chamber walls 22. In FIG. 1, two positions of the elevator tube positioning system 14 are shown, a lower vertical position of the workpiece support 18 is shown in solid line while a higher vertical position of the workpiece support 18 is shown in dashed line.

Heat is applied to the workpiece 16 via the heating elements 20. Positioning and heating of workpiece 16 within the processing chamber 12 is controlled via control electronics (not shown). During processing of the workpiece 16, the processing chamber interior region 15 is maintained at a desired reduced pressure condition by a pumping system (not shown).

In addition to the workpiece support 18, the elevator tube positioning system includes an elevator tube assembly 24 (best seen in FIG. 2), which supports the workpiece support 18 for vertical movement within the processing chamber 12. The elevator tube assembly 24 includes an elevator tube 26 that protrudes through an opening 27 in a floor 28 of the processing chamber 12 and is supported vertical movement by a coupling 29 positioned in the processing chamber floor opening 27. The elevator tube 26 is preferably made from a ceramic-based material to prevent metallic contamination within the processing chamber 12 and that can withstand high temperatures within the chamber 12. Preferably, the ceramic-based material is quartz. Another possible ceramic-based material is alumina.

The coupling 29 (FIG. 1) includes an air bearing 30 and a surrounding compliant member 34. The air bearing 30 centers the tube 26 within the bearing and prevents the flow of gas into the processing chamber interior region 15. The bearing 30 is mounted within the processing chamber floor opening 27 and is disposed concentrically about the elevator tube 26. An inner bearing surface 32 is in close proximity to an outer surface of the tube 26. A gas port supplies pressurized gas into a gas curtain defined by the gas flow between the tube 26 and the inner bearing surface 32. The gas curtain prevents incursion of ambient air into the processing chamber. The compliant member 34 is adjacent to the bearing 30 and disposed between the bearing 30 and the processing chamber floor 28 for absorbing a force created if and when that the elevator tube 26 contacts the inner bearing surface 32. The complaint member 34 may be a metal bellows.

If and when the tube 26 moves laterally with respect to a centerline CL of the coupling 29 during movement along its path of travel, the tube 26 pushes against the bearing 30 causing pressure variations within the gas curtain. The surrounding complaint member 34 deflects laterally in response and absorbs the force of the tube 26 while allowing the gas curtain pressure to actively center itself with respect to the tube 26. In this manner, the lateral movement of the tube 26 relative to the bearing 30 is limited to reduce contact forces between the tube 26 and the bearing 30. A suitable coupling is disclosed in U.S. application Ser. No. 10/646,228, filed on Aug. 22, 2003. Application Ser. No. 10/646,228 is assigned to the assignee of the present invention and is incorporated in its entirety herein by reference.

The elevator tube positioning system 14 also includes a carriage assembly 40 which is coupled to the elevator tube 26 and provides for movement of the tube 26. In order to minimize vibration transmitted from external sources to the workpiece 16, in the present invention, the elevator tube 26 is mechanically isolated from the carriage assembly 40. Instead of a mechanical linkage, the carriage assembly 40 moves the elevator tube 26 vertically along a path of travel via repulsive magnetic forces, as will be explained below. Since the carriage assembly 40 and the elevator tube 26 are physically spaced apart, any vibration that the carriage assembly 40 is subjected to from external sources will not be transmitted to the elevator tube 26 and, therefore, will not be transmitted to the workpiece 16.

The carriage assembly 40 includes a carriage 42 that, under the control of the control electronics, traverses a set of rails 46 (FIG. 1) to move the elevator tube 26 and the workpiece support 18 vertically along a path of travel. Affixed to the carriage 42 is an elevator or shaft support 44. The shaft support 44 includes a cylindrical or annular magnet 50, shown in cross section in FIG. 3. A cylindrical or annular magnet 52 is also affixed to an end 53 the elevator tube 26. The polarity of the magnets 50, 52 is arranged such that both magnets have the same polarity along the surfaces 54, 56 facing each other. In FIG. 3, for example, both surfaces 54, 56 are shown as having north pole polarities. Of course, both surfaces 54, 56 could be polarized to have south pole polarities. The strength of the magnets 50, 52 is sufficient such that the repulsive magnetic forces between the like-polarized surfaces 54, 56 cause a space or gap 57 between the surfaces 54, 56. In essence, because of the repulsive magnetic forces between the magnets 50, 52, the elevator tube 26 "floats" on and is mechanically isolated from the shaft support 44.

The magnets 50, 52 are disposed within respective plastic shells 60, 62 to prevent contamination. The magnetic strength of the magnets 50, 52 is selected to be such that during maximum acceleration of the elevator tube 26, the surfaces 54, 56 never contact each other.

Affixed to an upper surface 48 of the shaft support 44 is an air bearing 66 that functions to keep the elevator tube 26 vertically aligned and centered with respect to the centerline CL of the coupling 29 by forming a gas cushion or curtain between an outer surface of the tube 26 and an inner surface of the bearing 66. As can best be seen in FIG. 4, to form the gas cushion, gas from a gas supply (not shown) is directed through an inlet port 68 and flows through a concentric ring of inlet orifices 70 into a gas curtain region 72 that is the gap between the outer surface of the elevator tube 26 and the bearing 66. The supplied gas flows upward from each inlet orifice 70 to a corresponding concentric ring of exhaust orifices 74. The gas removed via the exhaust orifices 74 is removed via an outlet port 76.

SECOND PREFERRED EMBODIMENT

A second preferred embodiment of an elevator tube positioning system 14' of the present invention is shown schematically in cross section in FIG. 5. In this embodiment, the shaft support 44' is augmented with a second cylindrical or annular magnet 58' positioned vertically above the first magnet 50'. The magnet 58', like the magnets 50', 52' is encased in a plastic shell 78'. The polarity of the second magnet 58' of the shaft support 44' is selected such that a polarity of a surface 59' is the same as a polarity of the surface 80' of the magnet 52' affixed to the elevator shaft 26'. For example, as can be seen schematically in FIG. 5, the facing surfaces 59' and 80' are both polarized with a north magnetic pole polarity, while the facing surfaces 54', 56' are both polarized with a south magnetic pole polarity.

The magnetic strength of the magnets 50', 52', 58' is selected to be such that during maximum acceleration of the elevator tube 26', the surfaces 54', 56' and the surfaces 59', 80' never contact each other, that is, there is a gap 57' between the surfaces 54', 56' and there is a gap 82' between the surfaces 59', 80'. The respective surfaces never contact even during maximum acceleration of the elevator tube 26'. Essentially, because of repulsive magnetic forces, the magnet 52' of the elevator tube 26' "floats" between the magnets 50' and 58' of the shaft support 44, thus, the elevator tube 26' is mechanically isolated from the shaft support 44'.

The purpose of the second magnet 58' affixed to the shaft support 44' is to create a preload condition on the elevator tube 26' because of the force exerted between the magnets 50' & 52' and 52' & 58'. The preloading the elevator tube 26' in this manner, the bandwidth of the control system can be increased because the preloading tends to filter out low frequency vibrations. Also, preloading advantageously decreases the effect of gravity on the payload since there are magnetic forces in both the upward and downward direction on the elevator shaft 26' as a result of the four magnet combination. As in the first embodiment, affixed to an upper surface 48' of the shaft support 44' is an air bearing 66' that functions to keep the elevator tube 26' centered with respect to the centerline CL of the coupling (the coupling is shown as 29 in the first embodiment).

Although the present invention has been described with a degree of particularity, it is the intent that the invention include all modifications and alterations from the disclosed design falling within the spirit or scope of the appended claims.

We claim:

1. A rapid thermal processing system for processing a workpiece, the processing system comprising:
    a) a processing chamber; and
    b) an elevator structure supporting the workpiece for movement within the processing chamber, the elevator structure including:
        1) workpiece support for supporting the workpiece;
        2) an elevator shaft coupled to the workpiece support, a section of the elevator shaft, external to the processing chamber, having a magnetic portion; and
        3) a moveable carriage coupled to the elevator shaft to provide movement of the workpiece within the processing chamber, the carriage including a shaft support having a magnetic portion, the magnetic portion of the shaft support being positioned with respect to the magnetic portion of the elevator shaft such that repulsive magnetic forces between the two magnetic portions maintain a gap between the elevator shaft and the shaft support of the moveable carriage as the shaft support and elevator shaft move along a path of travel.

2. The rapid thermal processing system of claim 1 wherein workpiece moves vertically within the processing chamber.

3. The rapid thermal processing system of claim 1 wherein the magnetic portion of the elevator shaft is an end region of the shaft.

4. The rapid thermal processing system of claim 1 wherein the magnetic portion of the elevator shaft includes a first region having a first polarity and a second region having a second polarity which is opposite the first polarity and the magnetic portion of the shaft support includes first and second spaced apart magnetic regions, the first magnetic region having the first polarity and the second magnetic region having the second polarity, shaft support positioned with respect to the elevator shaft such that repulsive magnetic forces exist between the first region of the magnetic portion of the shaft support and the first region of the magnetic portion of the elevator shaft and repulsive magnetic forces exist between the second region of the magnetic portion of the shaft support and the second region of the magnetic portion of the elevator shaft.

5. The rapid thermal processing system of claim 4 wherein the first and second regions of the magnetic portion of the elevator shaft comprise north and south poles of a magnet affixed to the elevator shaft.

6. The rapid thermal processing system of claim 5 wherein the first region of the magnetic portion of the shaft support comprises a north pole of a first magnet and the second region of the magnetic portion of the shaft support comprises a south pole of a second magnet, the first and second magnets being spaced apart.

7. The thermal processing system of claim 6 wherein the magnet affixed to the elevator shaft extends radially outwardly from the shaft and is disposed in a gap between the spaced apart first and second magnets of shaft support.

8. The rapid thermal processing system of claim 1 wherein the elevator shaft is comprised of a ceramic-based material.

9. The rapid thermal processing system of claim 8 wherein the elevator shaft is comprised of a quartz-based material.

10. The rapid thermal processing system of claim 8 wherein the elevator shaft is comprised of alumina-based material.

11. An elevator tube positioning system comprising:
    a) a workpiece support for supporting a workpiece within a processing chamber;
    b) an elevator tube coupled to the workpiece support, a section of the elevator tube, external to the processing chamber, having a magnetic portion; and
    c) a moveable carriage coupled to the elevator tube to provide movement of the workpiece within the processing chamber, the carriage including a shaft support having a magnetic portion, the magnetic portion of the shaft support being positioned with respect to the magnetic portion of the elevator tube such that repulsive magnetic forces between the two magnetic portions maintain a gap between the elevator tube and the shaft support of the moveable carriage as the shaft support and elevator tube move along a path of travel.

12. The elevator tube positioning system of claim 11 wherein workpiece moves vertically within the processing chamber.

13. The elevator tube positioning system of claim 11 wherein the magnetic portion of the elevator tube is an end region of the tube.

14. The elevator tube positioning system of claim 11 wherein the magnetic portion of the elevator tube includes a first region having a first polarity and a second region having a second polarity which is opposite the first polarity and the magnetic portion of the shaft support includes first and second spaced apart magnetic regions, the first magnetic region having the first polarity and the second magnetic region having the second polarity, shaft support positioned with respect to the elevator tube such that repulsive magnetic forces exist between the first region of the magnetic portion of the shaft support and the first region of the magnetic portion of the elevator tube and repulsive magnetic forces exist between the second region of the magnetic portion of the shaft support and the second region of the magnetic portion of the elevator tube.

15. The elevator tube positioning system of claim 14 wherein the first and second regions of the magnetic portion of the elevator tube comprise north and south poles of a magnet affixed to the elevator shaft.

16. The elevator tube positioning system of claim 15 wherein the first region of the magnetic portion of the shaft support comprises a north pole of a first magnet and the second region of the magnetic portion of the shaft support comprises a south pole of a second magnet, the first and second magnets being spaced apart.

17. The elevator tube positioning system of claim 16 wherein the magnet affixed to the elevator tube extends radially outwardly from the tube and is disposed in a gap between the spaced apart first and second magnets of shaft support.

18. The elevator tube positioning system of claim 11 wherein the elevator tube is comprised of a ceramic-based material.

19. The elevator tube positioning system of claim 18 wherein the elevator tube is comprised of a quartz-based material.

20. The elevator tube positioning system of claim 18 wherein the elevator tube is comprised of alumina-based material.

21. A method of positioning a workpiece in a rapid thermal processing system, the steps of the method comprising:
    a) providing a processing chamber;
    b) providing an elevator structure supporting the workpiece for movement within the processing chamber, the elevator structure including:
        1) workpiece support for supporting the workpiece;
        2) an elevator shaft coupled to the workpiece support, a section of the elevator shaft, external to the processing chamber, having a magnetic portion; and
        3) a moveable carriage coupled to the elevator shaft to provide movement of the workpiece within the processing chamber, the carriage including a shaft support having a magnetic portion, the magnetic portion of the shaft support being positioned with respect to the magnetic portion of the elevator shaft such that repulsive magnetic forces between the two magnetic portions maintain a gap between the elevator shaft and the shaft support of the moveable carriage as the shaft support and elevator shaft move along a path of travel; and
    c) moving the carriage to position the workpiece at a desired position within the processing chamber.

22. The method of positioning a workpiece in a rapid thermal processing system set forth in claim 21 wherein workpiece moves vertically within the processing chamber.

23. The method of positioning a workpiece in a rapid thermal processing system set forth in claim 21 wherein the magnetic portion of the elevator shaft is an end region of the shaft.

24. The method of positioning a workpiece in a rapid thermal processing system set forth in claim 21 wherein the magnetic portion of the elevator shaft includes a first region having a first polarity and a second region having a second polarity which is opposite the first polarity and the magnetic portion of the shaft support includes first and second spaced apart magnetic regions, the first magnetic region having the first polarity and the second magnetic region having the second polarity, shaft support positioned with respect to the elevator shaft such that repulsive magnetic forces exist between the first region of the magnetic portion of the shaft support and the first region of the magnetic portion of the elevator shaft and repulsive magnetic forces exist between the second region of the magnetic portion of the shaft support and the second region of the magnetic portion of the elevator shaft.

25. The method of positioning a workpiece in a rapid thermal processing system set forth in claim 24 wherein the first and second regions of the magnetic portion of the elevator shaft comprise north and south poles of a magnet affixed to the elevator shaft.

26. The method of positioning a workpiece in a rapid thermal processing system set forth in claim 25 wherein the first region of the magnetic portion of the shaft support comprises a north pole of a first magnet and the second region of the magnetic portion of the shaft support comprises a south pole of a second magnet, the first and second magnets being spaced apart.

27. The method of positioning a workpiece in a rapid thermal processing system set forth in claim 26 wherein the magnet affixed to the elevator shaft extends radially outwardly from the shaft and is disposed in a gap between the spaced apart first and second magnets of shaft support.

28. The method of positioning a workpiece in a rapid thermal processing system set forth in claim 21 wherein the elevator shaft is comprised of a ceramic-based material.

29. The method of positioning a workpiece in a rapid thermal processing system set forth in claim 28 wherein the elevator shaft is comprised of a quartz-based material.

30. The method of positioning a workpiece in a rapid thermal processing system set forth in claim 28 wherein the elevator shaft is comprised of alumina-based material.

* * * * *